(12) United States Patent
Matsumura et al.

(10) Patent No.: US 7,611,377 B2
(45) Date of Patent: Nov. 3, 2009

(54) INTERFACE APPARATUS FOR ELECTRONIC DEVICE TEST APPARATUS

(75) Inventors: Shigeru Matsumura, Tokyo (JP); Kazutaka Osawa, Tokyo (JP); Hiroyuki Hama, Tokyo (JP); Yuichiro Izumi, Tokyo (JP)

(73) Assignee: Advantest Corporation, Tokyo (JP)

( * ) Notice: Subject to any disclaimer, the term of this patent is extended or adjusted under 35 U.S.C. 154(b) by 70 days.

(21) Appl. No.: 11/896,240

(22) Filed: Aug. 30, 2007

(65) Prior Publication Data

US 2008/0076297 A1 Mar. 27, 2008

(30) Foreign Application Priority Data

Sep. 22, 2006 (JP) .............................. 2006-257922

(51) Int. Cl.
*H01R 13/00* (2006.01)
(52) U.S. Cl. ...................................... 439/482
(58) Field of Classification Search ................. 439/61, 439/492, 578, 581; 324/750, 754
See application file for complete search history.

(56) References Cited

U.S. PATENT DOCUMENTS

| | | | | |
|---|---|---|---|---|
| 5,994,894 A | * | 11/1999 | Fujita | 324/158.1 |
| 7,053,643 B2 | * | 5/2006 | Ruff et al. | 324/761 |
| 7,230,437 B2 | * | 6/2007 | Eldridge et al. | 324/754 |
| 7,339,385 B2 | * | 3/2008 | Takasu et al. | 324/754 |
| 2007/0223156 A1 | * | 9/2007 | Kumagai et al. | 361/56 |

FOREIGN PATENT DOCUMENTS

| | | |
|---|---|---|
| JP | 10-185990 A | 7/1998 |
| JP | 11-030644 A | 2/1999 |
| JP | 2003-315408 A | 11/2003 |
| KR | 2003-0083559 A | 10/2003 |

\* cited by examiner

*Primary Examiner*—Renee S Luebke
*Assistant Examiner*—Larisa Tsukerman
(74) *Attorney, Agent, or Firm*—Birch, Stewart, Kolasch & Birch, LLP (57) ABSTRACT

An interface apparatus 5 mounted on a test head 4 comprises: an electrical cable 54 having one end electrically connected to a socket board 66; a device side connector 541 attached to the other end of the electrical cable 54; and a intermediate connector 53 electrically connecting a test head side connector 41 provided on the test head 4 and the device side connector 541 and the intermediate connector 53 having a connector body 531 provided at a bottommost part of the interface apparatus 5; an engagement hole 532 provided at the connector body 531 and having the device side connector 541 detachably connected to it; and an output terminal 537 provided at the connector body 531 and having the test head side connector 41 detachably connected to it.

6 Claims, 11 Drawing Sheets

INTERFACE APPARATUS FOR ELECTRONIC DEVICE TEST APPARATUS

TECHNICAL FIELD

The present invention relates to an interface apparatus mounted on a test head for testing semiconductor integrated circuit devices or other various electronic devices (hereinafter also referred to typically as "IC devices") and interconnecting electrical connections between the IC devices and the test head.

BACKGROUND ART

In the process of production of semiconductor integrated circuit devices and other various electronic devices, an electronic device test apparatus is used for testing performances and functions of IC devices in the state formed on a wafer or in a packaged state.

This electronic device test apparatus uses a handler or a prober to electrically connect IC devices to a test head and uses a tester to run tests on them. The test head is provided on top with a HiFix (High Fidelity Tester Access Fixture) or a wafer mother board (interface apparatus) for interconnecting electrical connections between the IC devices and the test head.

A conventional HiFix is provided at its topmost part with socket boards on which sockets having a large number of contact pins electrically contacting input/output terminals of IC devices are mounted and at its bottommost part with a interconnection board electrically connected to the socket boards through electrical cables. The interconnection board has the ends of the electrical cables directly soldered to it. The HiFix is electrically connected through this interconnection board to the test head.

To streamline the tests, one HiFix is provided with a large number of (for example, 32, 64, or 128) sockets. Further, several electrical cables are led out from each socket. For that reason, when fabricating a HiFix, several thousand electrical cables have to be soldered to the interconnection board. This consumes tremendous manpower and requires skilled workers and therefore has become a factor behind higher costs in a HiFix.

DISCLOSURE OF THE INVENTION

The present invention has as its object to provision an interface apparatus which is easy to fabricate.

To achieve the above object, according to the present invention, there is provided an interface apparatus mounted on a test head for testing a device under test and interconnecting an electrical connection between the device under test and the test head, wherein the interface apparatus comprises: an electrical cable having one end electrically connected to a measurement board electrically contacting the device under test; a device side connector attached to the other end of the electrical cable; and an intermediate connector electrically connecting a test head side connector provided on the test head and the device side connector, and the intermediate connector has a connector body provided at a position adjoining the test head at the interface apparatus, a first connection part provided at the connector body and to which the device side connector is detachably connected, and a second connection part provided at the connector body and to which the test head side connector is detachably connected.

In the present invention, a intermediate connector is employed instead of a interconnection board, so the soldering work of the ends of the electrical cables is eliminated, so the interface apparatus can be easily fabricated. Due to this, it is possible to reduce the manpower in production and special skilled workers are not required for the work, so the cost of the interface apparatus can be reduced.

While not particularly limited to this in the invention, preferably the intermediate connector has a plurality of the first connection parts and has a plurality of the second connection parts.

While not particularly limited to this in the invention, preferably the interface apparatus comprises a plurality of the intermediate connectors.

While not particularly limited to this in the invention, preferably the intermediate connector has a positioning pin projecting out toward the test head side connector, and the test head side connector has a positioning hole facing the positioning pin.

While not particularly limited to this in the invention, preferably the device under test is a packaged semiconductor device, and the measurement board is a socket board on which a socket electrically contacting the semiconductor device is mounted.

While not particularly limited to this in the invention, preferably the device under test is a semiconductor device formed on a wafer, and the measurement board is a probe card on which probe needles electrically contact the semiconductor device are mounted.

To achieve the above object, according to the present invention, there is provided an electronic device test apparatus for testing a device under test, wherein the electronic device test apparatus comprises: a test head electrically connected to the device under test at the time of a test; and the interface apparatus as set forth in any one of the above mounted on the test head and interconnecting electrical connections between the device under test and the test head.

BEST MODE FOR CARRYING OUT THE INVENTION

Below, embodiments of the present invention will be explained based on the drawings.

FIRST EMBODIMENT

Figure 1:
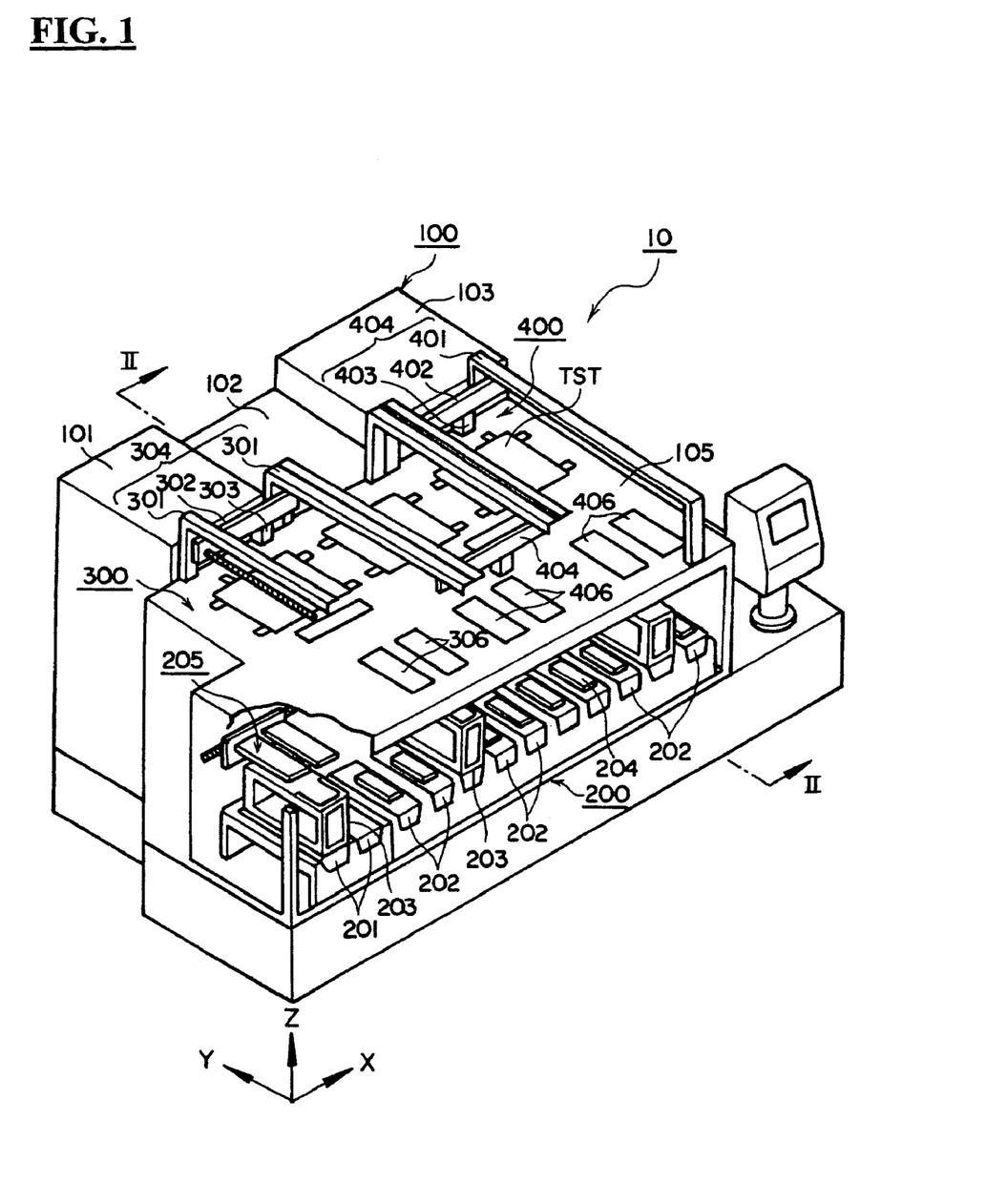
FIG. 1 is a perspective view showing an entire electronic device test apparatus according to a first embodiment of the present invention.
Figure 2:
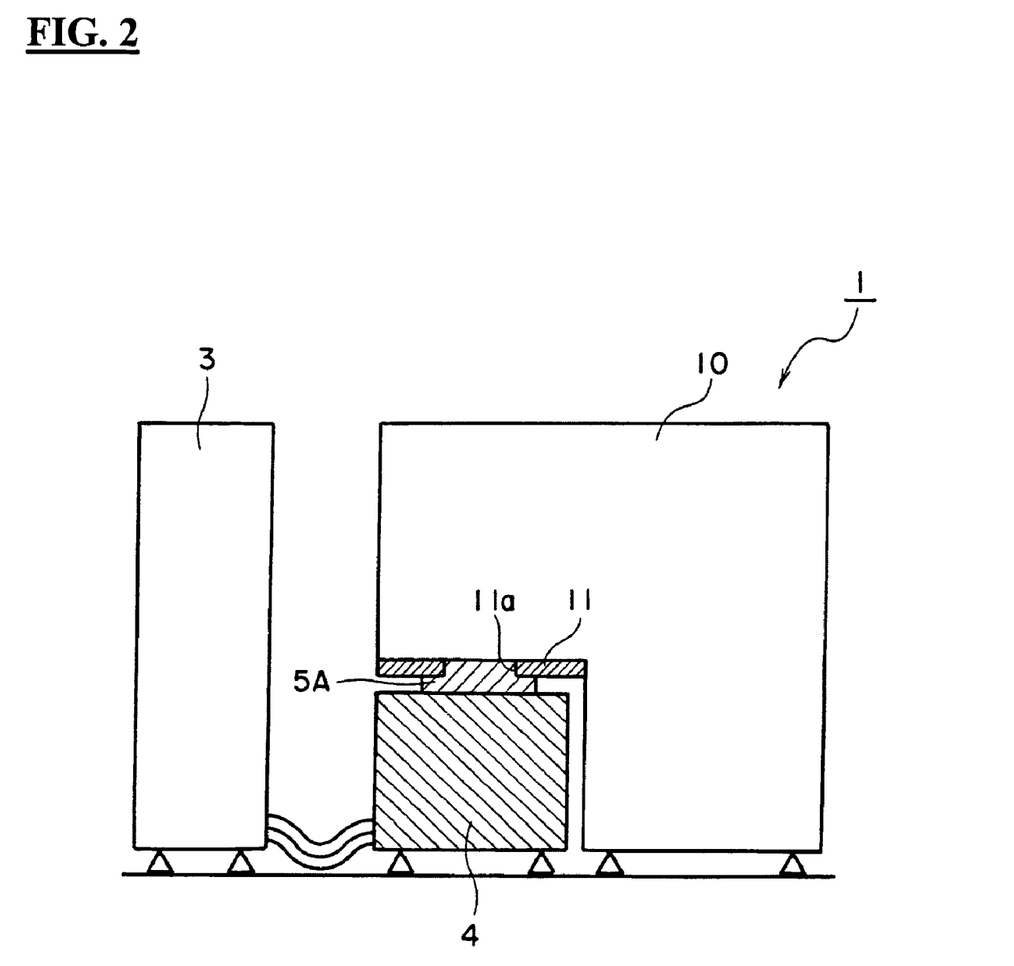
FIG. 2 is a schematic cross-sectional view along the line II-II of FIG. 1.
Figure 3:
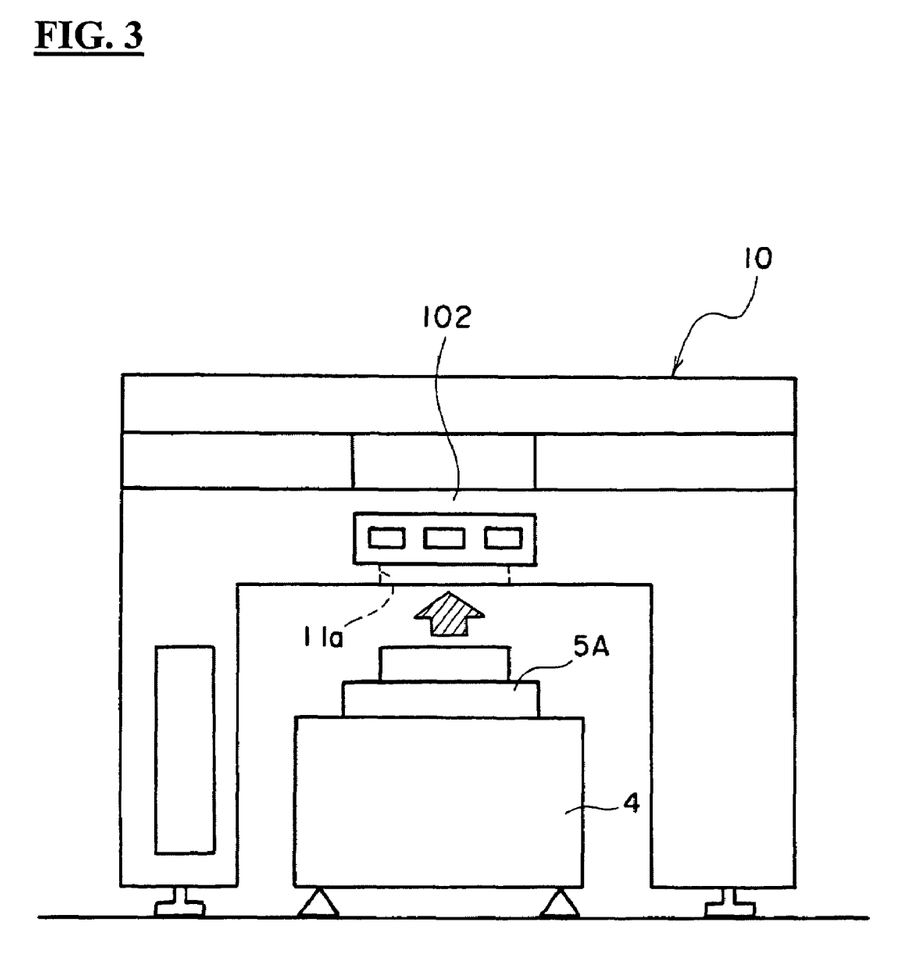
FIG. 3 is a back view of the electronic device test apparatus shown in FIG. 1.

FIG. 1 is a perspective view showing an entire electronic device test apparatus according to the present embodiment, FIG. 2 is a schematic sectional view along the line II-II of FIG. 1, and FIG. 3 is a back view of the electronic device test apparatus shown in FIG. 1. First, the overall configuration of an electronic device test apparatus according to the present embodiment will be explained in brief with reference to FIG. 1 to FIG. 3.

The electronic device test apparatus 1 according to the present embodiment, as shown in FIG. 1 and FIG. 2, comprises: a handler 10 for handling IC devices under test; a test head 4 to which IC devices under test are electrically connected; and a tester 3 for sending test signals to this test head 4 to run tests on the IC devices under test.

The handler 10 is a apparatus for supplying IC devices to the test head 4 in the state with the IC devices under test given high temperature or low temperature thermal stress and classifying the IC devices based on the test results after the tests are completed and comprises a storage unit 200, a loader unit 300, a chamber unit 100, and an unloader unit 400.

Customer trays holding a large number of IC devices under test are stored in the storage unit 200. In the loader unit 300, pre-test IC devices are reloaded from such a customer tray to a test tray (tray circulated inside handler 10), then the test tray is conveyed into the chamber unit 100. In the chamber unit 100, the IC devices are given predetermined thermal stress, then the IC devices are pushed against the test head 4 in the state carried on the test tray, the IC devices are electrically brought into contact with the sockets 66, and the IC devices are tested. The post-test IC devices are conveyed from the chamber unit 100 to an unloader unit 400 and are reloaded on customer trays in accordance with the test results.

The storage unit 200 is provided with pre-test IC stockers 201 for storing customer trays holding pre-test IC devices and post-test IC stockers 202 storing customer trays holding IC devices classified in accordance with the test results.

The pre-test IC stockers 201 and the post-test IC stockers 202 have tray support frames 203 and elevators 204 able to ascend and descend in the tray support frames 203. The tray support frames 203 support pluralities of not shown customer trays stacked together. These customer trays are able to move up and down by the elevators 204.

The pre-test IC stockers 201 hold stacks of customer trays holding pre-test IC devices. As opposed to this, the post-test IC stockers 202 hold stacks of customer trays holding post-test IC devices stored in accordance with the test results.

The customer trays stored in the pre-test IC stockers 201 are carried into the loader unit 300. In this loader unit 300, pre-test IC devices are reloaded from the customer trays to test trays.

The loader unit 300 is provided with an XY-conveyance system 304 reloading IC devices under test from the customer trays to the test trays. This XY-conveyance system 304 is, as shown in FIG. 1, provided with two rails 301 laid on a main frame 105, a movable arm 302 able to move by these two-rails 301 back and forth between the customer trays and the test trays (this direction being defined as the Y-direction), and a movable head 303 supported by this movable arm 302 and able to move along the movable arm 302 in the X-direction.

The movable head 303 of this XY-conveyance system 304 has pickup heads able to pick up and hold IC devices under test. For example, the movable head 303 has eight pickup heads mounted on it and can reload eight IC devices under test at a time from customer trays to test trays.

The main frame 105 of the loader unit 300 has a pair of windows 306, 306 formed in it so that customer trays carried to the loader unit 300 can approach the top surface of the main frame 105. While the illustration is omitted, each window 306 is provided with holding hooks for holding a customer tray and a customer tray is held at a position where the top surface of the customer tray approaches the surface of the main frame 105 through the window 306.

Further, below each window 306, an elevator table for raising and lowering a customer tray is provided. This elevator table lowers a customer tray emptied by unloading of pre-test IC devices and transfers it to the tray transport arm 205.

The chamber unit 100 comprises: a constant temperature tank 101 for applying the desired high temperature or low temperature thermal stress to the IC devices under test loaded on a test tray; a test chamber 102 pushing the IC devices under test in a state given temperature stress in this constant temperature tank 101 to the test head 4; and a thermal stress-relieving tank 103 relieving the temperature stress applied from the post-test IC devices.

When applying a high temperature at the constant temperature tank 101, in the thermal stress-relieving tank 103, air is blown against the IC devices under test to cool them and return them to room temperature. On the other hand, when using the constant temperature tank 101 to apply a low temperature of for example about −30° C., in the thermal stress-relieving tank 103, the IC device under tests are heated by hot air or a heater etc. to return them to a temperature of an extent where no condensation will occur. Further, the IC devices under test from which the stress was relieved are conveyed to the unloader unit 400.

As shown in FIG. 2 and FIG. 3, the base unit 11 of the handler 10 forming the bottom surface of the test chamber 102 is formed with an opening 11a at its substantial center. In the opening 11a, a HiFix 5 mounted on the top of the test head 4 is connected.

When a test tray is carried to the sockets 66 on this HiFix 5, a Z-axial drive system (not shown) pushes the IC devices under test to the HiFix 5 through a pusher (not shown) to make the input/output terminals of the large number of IC devices under test on the test tray electrically contact the contact pins of the sockets 66. Further, the tester 3 sends test signals through the test head 4 to the IC devices under test and runs tests on the IC devices under test. The results of the tests are stored at addresses determined for example by the identification number assigned to the test tray and the numbers of the IC devices under test assigned inside the test tray. A test tray finished being tested is conveyed to the unloader unit 400 after the temperatures of the IC devices return to room temperature in the thermal stress-relieving tank 103.

The unloader unit 400 is also provided with an XY-conveyance system 404, 404 of the same structure as the XY-conveyance system 304 provided at the loader unit 300. This XY-conveyance system 404 is used to reload post-test IC devices from a test tray conveyed to the unloader unit 400 to the customer trays.

The main frame 105 of the unloader unit 400 is provided with two pairs of windows 406, 406 arranged so that customer trays carried to the unloader unit 400 can approach the top surface of the main frame 105. While the illustration will be omitted, each window 406 is provided with holding hooks for holding customer tray and a customer tray is held at a position where the top surface of the customer tray approaches the surface of the main frame 105 through the windows 406.

Further, below each window 406, elevator table for raising and lowering a customer tray is provided. This elevator table lowers customer tray filled by post-test IC devices and transfers them to the tray transport arm 205.

As shown in FIG. 1, the storage unit 200 is provided with a tray transport arm 205 able to move over the stockers 201, 202. This tray transport arm 205 can transport customer trays between the loader unit 300, the unloader unit 400 and the stockers 201, 202.

Figure 4:
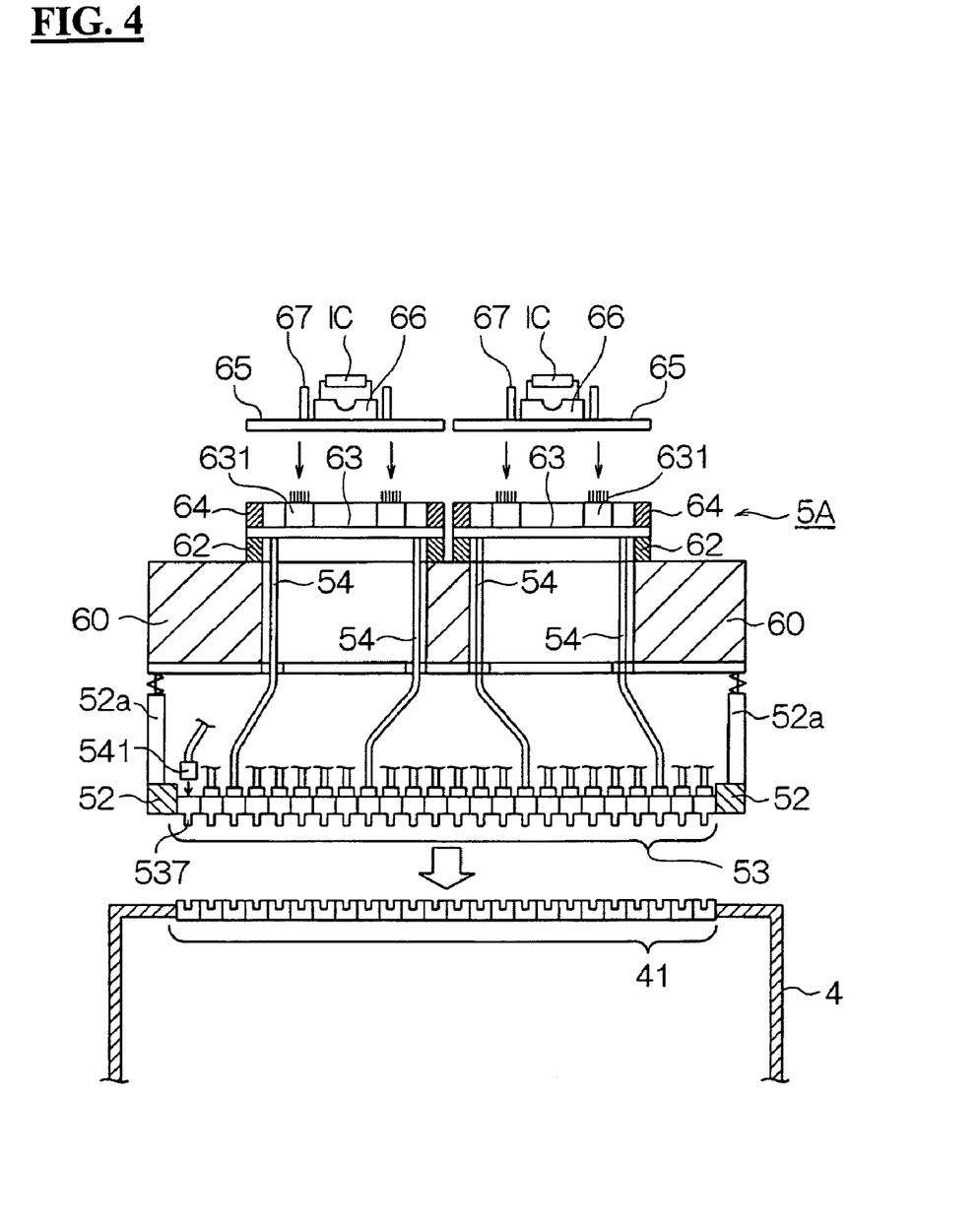
FIG. 4 is a cross-sectional view showing a HiFix and a test head according to a first embodiment of the present invention.
Figure 5:
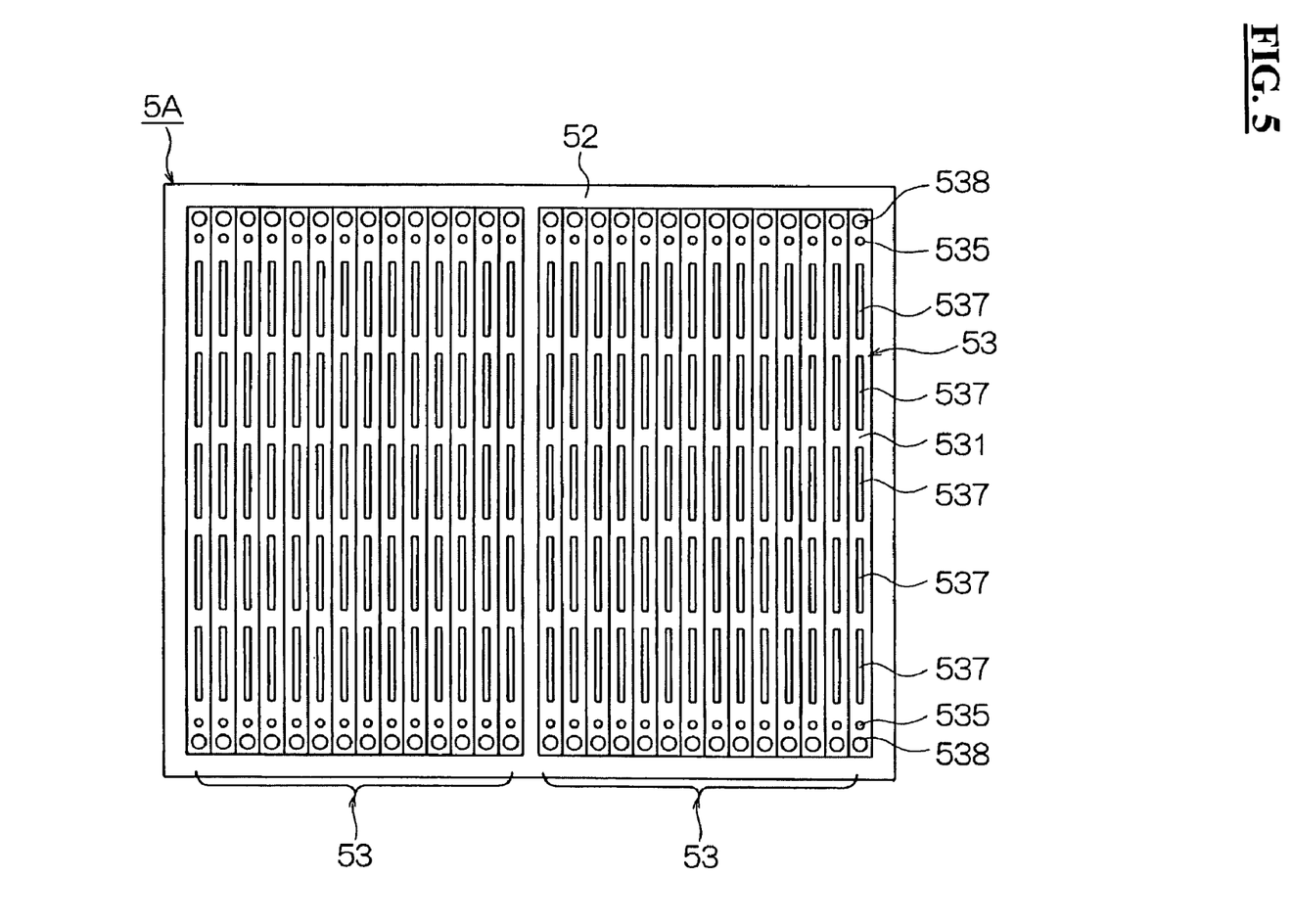
FIG. 5 is a plan view of a HiFix according to the first embodiment of the present invention seen from the bottom side.
Figure 6:
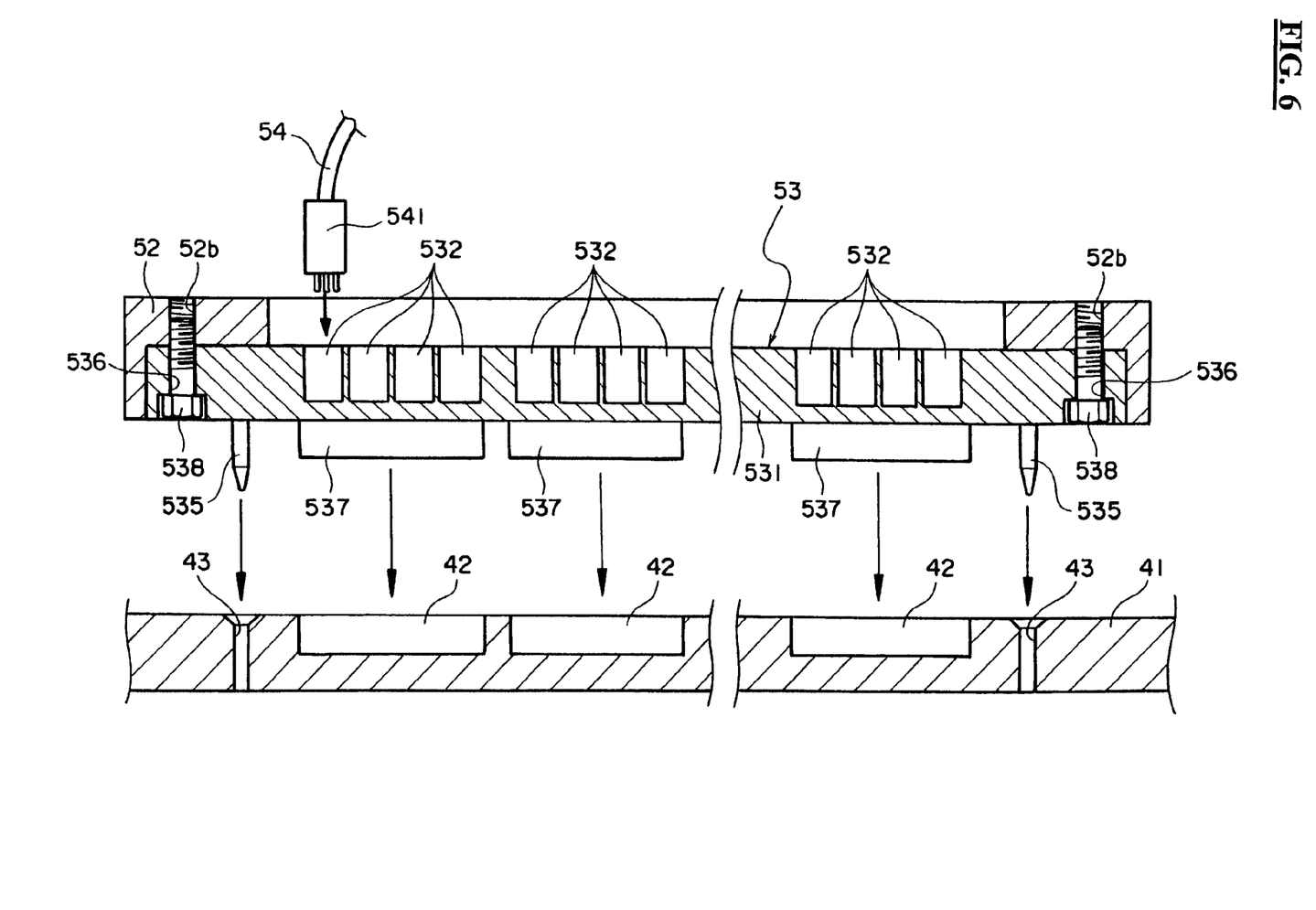
FIG. 6 is a cross-sectional view showing a device side connector, an intermediate connector, and a test head side connector in the first embodiment of the present invention.
Figure 7:
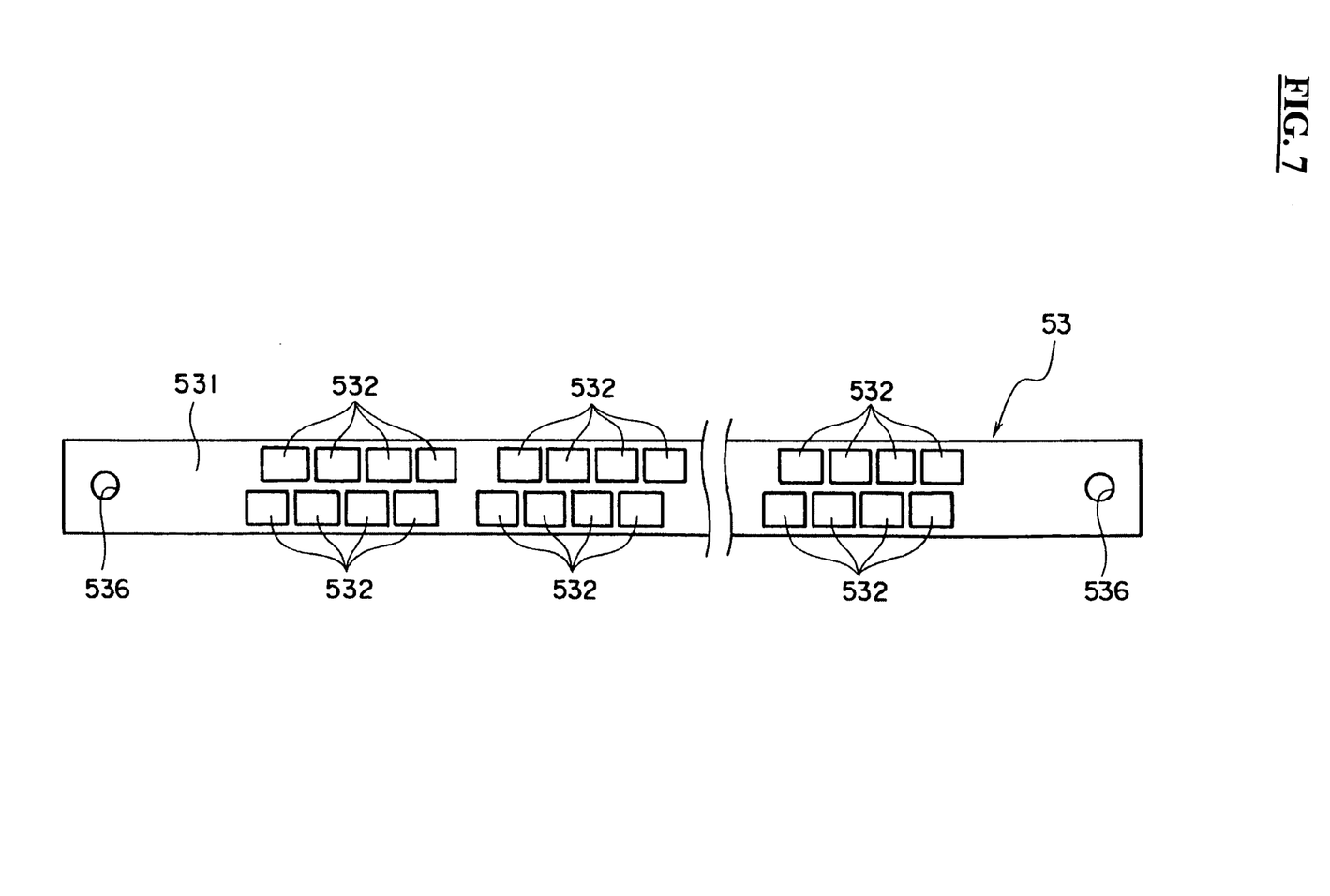
FIG. 7 is a top plan view showing an intermediate connector in the first embodiment of the present invention.
Figure 8:
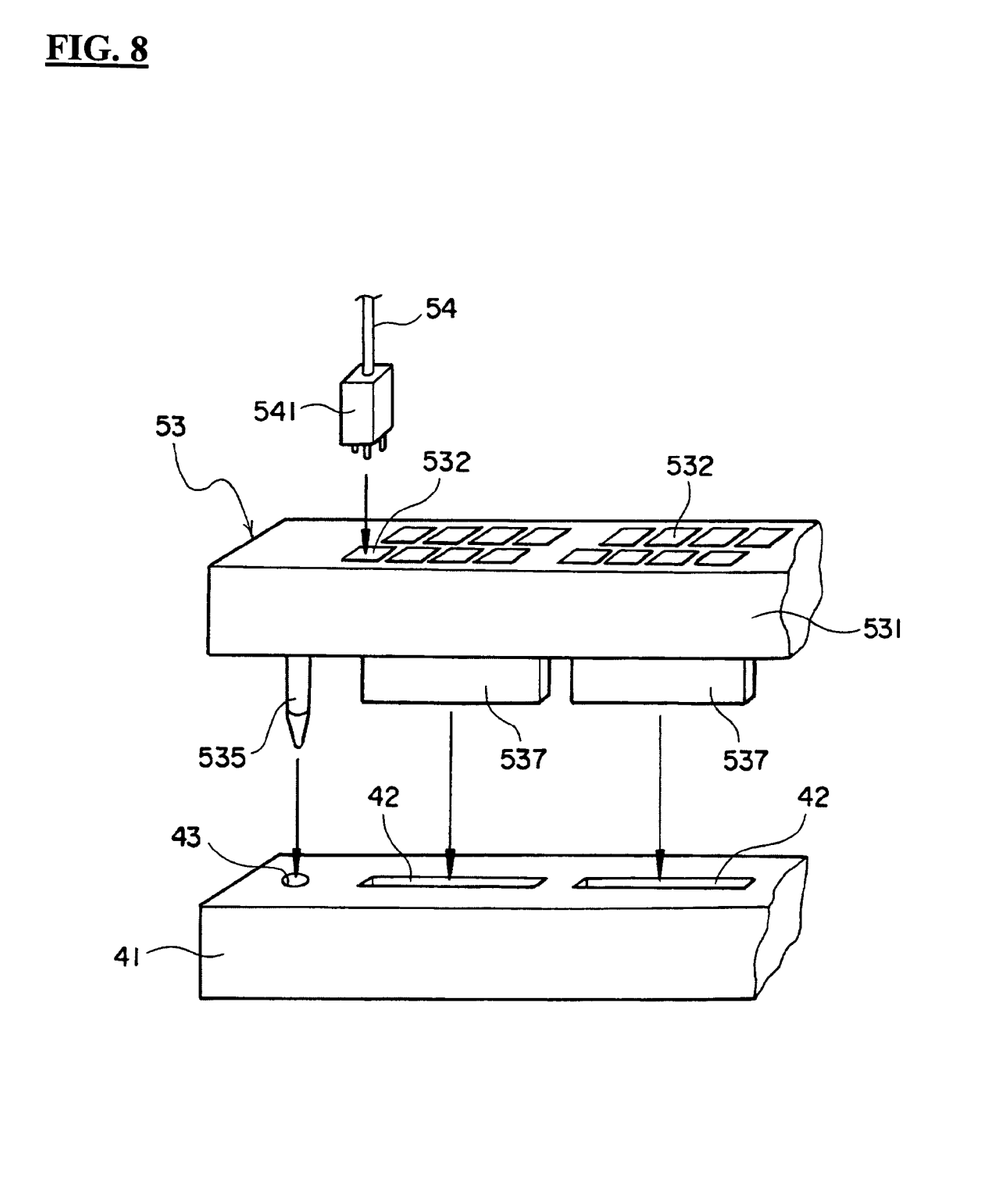
FIG. 8 is a partial perspective view of a device side connector, an intermediate connector, and a test head side connector in the first embodiment of the present invention.

FIG. 4 is a cross-sectional view showing a HiFix and a test head according to the present embodiment, FIG. 5 is a plan view of a HiFix according to the present embodiment as seen from below, FIG. 6 is a cross-sectional view showing a device side connector, an intermediate connector, and a test head side connector in the present embodiment, FIG. 7 is a top plan view showing an intermediate connector in the present embodiment, and FIG. 8 is a partial perspective view of a device type connector, an intermediate connector, and a test head side connector in the present embodiment.

The HiFix 5A according to the present embodiment, as shown in FIG. 4, is an SBC (Socket Board Change) type enabling a change in kind of IC devices under test to be handled by replacing just the topmost part socket boards 66. This HiFix 5A, as shown in the drawing, is mounted on the top of the test head 4 through test head side connectors 41 provided on the top of the test head 4 and intermediate connectors 53.

The HiFix 5A, as shown in FIG. 5, has a plurality of (28 in the example shown in FIG. 5) intermediate connectors 53. These intermediate connectors 53 are positioned at the bottommost part of the HiFix 5A and are fastened to a frame-shaped frame 52 in the state arranged substantially in parallel along the depth direction of the HiFix 5A.

Each intermediate connector 53 has a substantially square cross-section rod-shaped housing 531 as shown in FIG. 6 and FIG. 7. The top surface of the housing 531 of each intermediate connector 53 is formed with a plurality of engagement holes 532. These engagement holes 532 may have device side connectors 541 attached to ends of electrical cables 54 engaged with them. In the present embodiment, a plurality of engagement holes 532 are arranged in two rows along the depth direction of the HiFix 5A.

Note that as the electrical cables 54, for example, coaxial cables for transmitting high speed signals, single wires for supplying power or transmitting low speed signals, etc. may be mentioned.

By forming a plurality of engagement holes 532 at a single intermediate connector 53, the work efficiency of attaching the intermediate connectors 53 to the frame 52 of the HiFix 5A and the work efficiency at the time of maintenance of the intermediate connectors 53 are improved.

Further, by dividing the intermediate connectors 53 into several parts (28 in the example shown in FIG. 5), compared with the case of forming all engagement holes 532 in a single intermediate connector, the work efficiency in maintenance of the intermediate connectors 53 is improved.

Note that, in the present embodiment, as shown in FIG. 7, a plurality of engagement holes 532 are arranged in two rows across the entire depth of the HiFix 5A per one intermediate connector 53, but the present invention is not particularly limited to this. For example, it is also possible to arrange the plurality of engagement holes 532 in a single row or three rows or more across the entire depth of the HiFix 5A or, for example, arrange M×N number of engagement holes 532 in a M-row N-column array (where, M and M are all natural numbers, at least one of which is 2 or more).

At the bottom surface of the housing 531 of the intermediate connectors 531, a plurality of output terminals 537 engaging with engagement holes 42 of the test head side connectors project out downward.

Note that the engagement hole 532 of the intermediate connector 53 in the present embodiment corresponds to the first connection part in the present invention, while the output terminal 537 of the intermediate connector 53 in the present embodiment corresponds to the second connection part in the present invention.

As shown in FIG. 6, guide pins 535 projecting downward are provided at the bottom both ends of the housing 531 of the intermediate connectors 53. Further, guide holes 43 are formed so as to face the guide pins 535 at the top both ends of the test head side connector 41 provided at the top of the test head 4. When mounting the HiFix 5A on the test head 4, the guide pins 535 are guided into the guide holes 43, whereby the HiFix 5A can be easily positioned with respect to the test head 4. Note that it is also possible to provide guide holes in the intermediate connectors 53 and provide guide pins in the test head side connectors 41.

Further, as shown in the drawing, the housing 531 of the intermediate connectors 53 is formed at its bottom both ends with through holes 536 passing through the housing 531 from the bottom surface toward the top surface. The frame 52 is formed with fastening holes 52b at positions corresponding to the through holes 536. By fastening bolts 538 into the fastening holes 52b through the through holes 536, it becomes possible to fasten the intermediate connectors 53 to the frame 52.

Returning to FIG. 4, a spacing frame 93 is provided at the top of the frame 52 fastening the plurality of intermediate connectors 53 through spacer posts 52a able to move up and down somewhat along the Z-axial direction.

At the top part of the spacing frame 60, sub socket boards 63 are provided through sub socket board spacers 62. Further, at the tops of the sub socket boards 63, socket boards 65 are provided through socket board spacers 64.

Further, the intermediate connectors 53 and the sub socket boards 63 are connected by a plurality of electrical cables 54. At the bottom ends of the electrical cables 54, device side connectors 541 are attached. The device side connectors 541 can be detachably connected to the engagement holes 532 of the intermediate connectors 53. On the other hand, the top ends of the electrical cables 54 are directly connected to the sub socket boards 63 by soldering.

As shown in FIG. 8, when the device side connector 541 is engaged with the engagement hole 532, the terminals of the device side connector 541 are electrically connected to the output terminal 537 of the intermediate connector 53. Further, when the output terminal 537 of the intermediate connector 53 is engaged with the engagement hole 42 of the test head side connector 41, the HiFix 5A and the test head 4 are electrically connected. Note that the test head side connector 41, while not particularly illustrated, is electrically connected to a pin electronics board held in the test head 4.

In the present embodiment, intermediate connectors 53 are employed instead of the conventional interconnection board, so the soldering work of the ends of the electrical cables 54 is eliminated and the HiFix 5A can be easily fabricated.

The sub socket boards 63 are provided with intermediate terminals 631. The intermediate terminals 631 are used for electrical connection of the sub socket boards 63 and the socket boards 65.

Note that for convenience in explanation, FIG. 4 shows only two socket boards 65, but in actuality for example 64 socket boards 65 are arranged in a four-row 16-column array.

Each socket board 65 is provided on top with a socket 66 having a plurality of contact pins (not shown). That socket 66 is provided around it with a socket guide 67. Note that the socket guide 67 is a guide means for positioning an IC device under test when bringing the IC device into electrical contact with the contact pins of the socket 66 and may be omitted in some cases.

In the above first embodiment, the example of application of the present invention to the SBC type of HiFix was explained, but the invention is not particularly limited to this. The present invention can also be applied to the following various types of HiFixes.

SECOND EMBODIMENT

Figure 9:
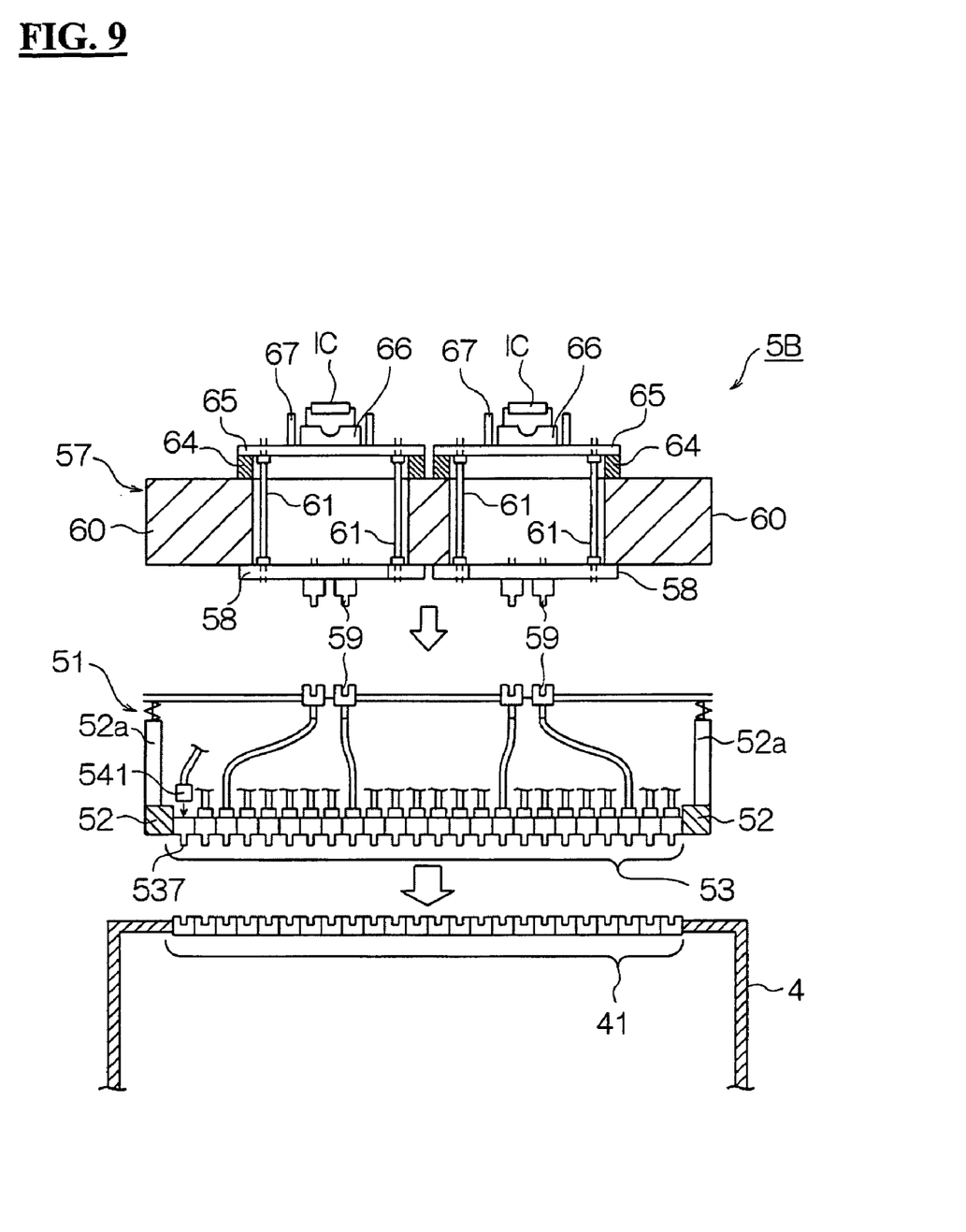
FIG. 9 is a cross-sectional view showing a HiFix and a test head according to a second embodiment of the present invention.

FIG. 9 is a cross-sectional view showing a HiFix and a test head according to a second embodiment of the present invention.

The HiFix 5B according to the present embodiment, as shown in FIG. 9, is a CLS (Cable Less) type of HiFix enabling a change in kind of IC devices under test to be handled by replacement of a topmost DSA (Device Specific Adapter) 57. This HiFix 5B, as shown in the drawing, comprises: a mother board 51 mounted on the top of the test head 4; and a DSA 57 mounted to this mother board 51.

The HiFix 5B according to the present embodiment is configured integrally from the sockets 66 to the spacing frame 60 as the DSA 57. This differs from the HiFix 5A according to the first embodiment in the point that the DSA 57 can be attached to and detached from the mother board 51 by the connectors 59.

The DSA 57 is configured with the spacing frame 60 provided on top of performance boards 58 and further with socket boards 65 provided on top of them through socket board spacers 64. Sockets 66 are mounted on the socket boards 65.

The performance boards 58 and the socket boards 65 are connected by connect boards 61. Further, the performance boards 58 are provided with a plurality of pairs of connectors 59 for attachment to/detachment from the mother board 51. One of these connectors 59 is attached to one end of an electrical cable 54.

In the same way as first embodiment, a device side connector 541 is attached to the other end of the electrical cable 54. At the bottommost part of the HiFix 5B according to the present embodiment, a plurality of intermediate connectors 53 explained in detail of the first embodiment are provided in the state arranged substantially in parallel in the depth direction of the HiFix 5B. The device side connectors 541 are detachably connected to the engagement holes 532 of the intermediate connectors 53.

When the device side connector 541 is engaged with the engagement hole 532 of the intermediate connector 53, the terminals of the device side connector 541 are electrically connected to the output terminal 537 of the intermediate connector 53. Further, when the output terminal 537 of the intermediate connector 53 is engaged with the engagement hole 42 of the test head side connector 41, the HiFix 5B and the test head 4 are electrically connected.

THIRD EMBODIMENT

Figure 10:
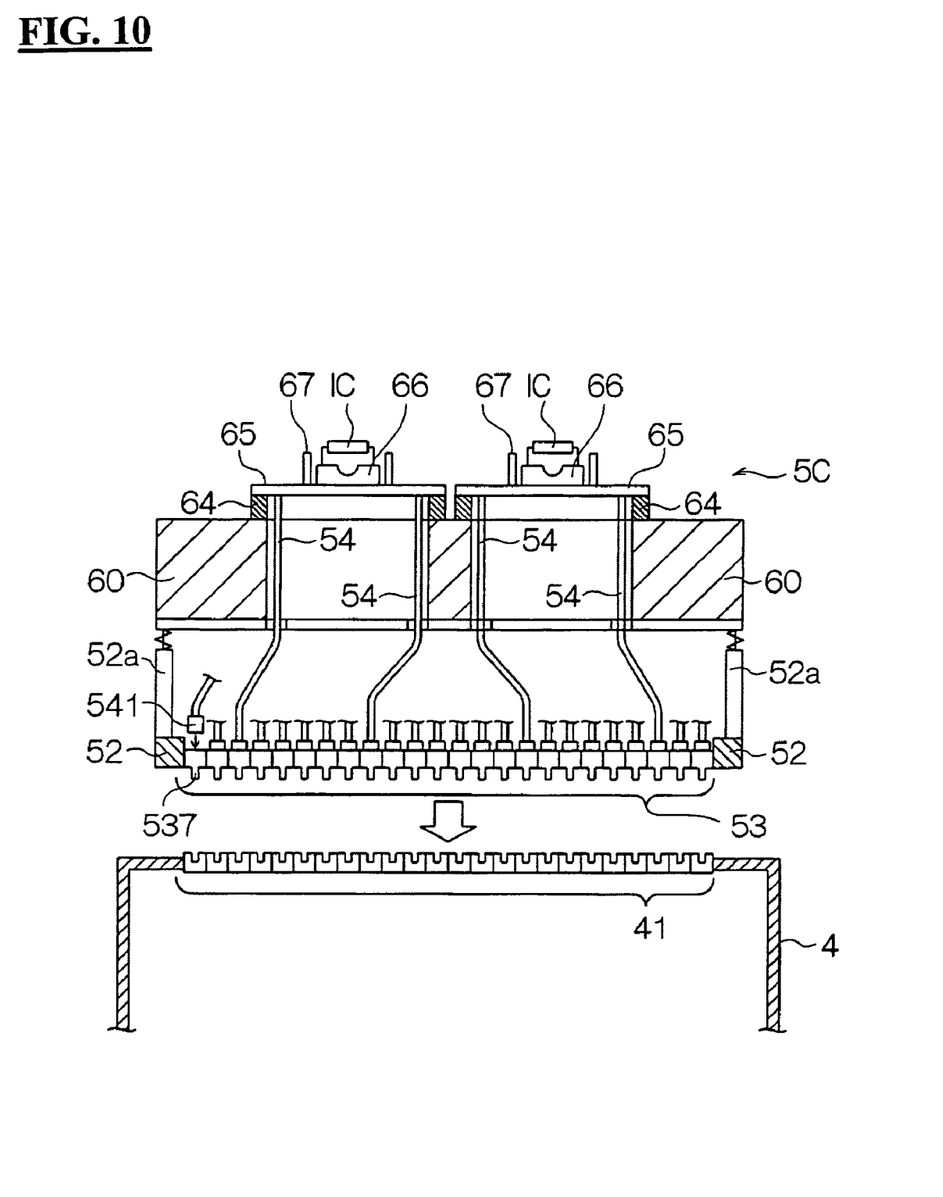
FIG. 10 is a cross-sectional view showing a HiFix and a test head according to a third embodiment of the present invention.

FIG. 10 is a cross-sectional view showing a HiFix and a test head according to a third embodiment of the present invention.

The HiFix 5C according to the present embodiment, as shown in FIG. 10, is a CCN (Cable Connection) type of a HiFix where the entire HiFix 5C is replaced each time changing the kind of the IC devices under test. This HiFix 5C differs from the HiFixes 5A, 5B according to the first and second embodiment in the point that there are no separable locations at the HiFix 5C at all.

At the bottommost part of this HiFix 5C, a plurality of intermediate connectors 53 explained in the first embodiment are provided in the state arranged substantially in parallel along the depth direction of the HiFix 5C. The device side connectors 541 attached to the ends of the electrical cables 54 are detachably connected to the engagement holes 532 of the intermediate connectors 53.

The other ends of the electrical cables 541 are directly connected by soldering to the socket boards 65. The socket boards 65 have sockets 66 mounted on them. In the present embodiment, since the intermediate connectors 53 and the socket boards 65 are directly connected, high quality test performance can be secured.

When the device side connector 541 is engaged with the engagement hole 532 of the intermediate connector 53, the terminals of the device side connector 541 are electrically connected to the output terminal 537 of the intermediate connector 53. Further, when the output terminal 537 of the intermediate connector 53 is engaged with the engagement hole 42 of the test head side connector 41, the HiFix 5C and the test head 4 are electrically connected.

In the above-explained first to third embodiments, by employing the intermediate connectors 53 instead of the conventional interconnection board, the work of soldering the ends of the electrical cables 54 is eliminated, so the HiFixes 5A to 5C can be easily fabricated.

Further, when employing the conventional interconnection board, it is necessary to design the circuit wiring in advance and fabricate a specialized board. As opposed to this, in the present embodiment, by selectively connecting the device side connectors 541 to the intermediate connectors 53, it is possible to form any circuit wiring.

Further, when repairing or replacing the conventional interconnection board, the soldered locations have to be removed and the work efficiency deteriorates. As opposed to this, in the present embodiment, it is possible to repair or replace the intermediate connectors 53 by just attaching and detaching the device side connectors 541 to and from the intermediate connectors 53, so the maintenance ability is superior.

Further, when employing the conventional interconnection board, impedance mismatch occurs due to the through holes etc. and the transmission properties of the high frequency signals deteriorate. As opposed to this, in the present embodiment, since no circuit board is used, impedance mismatch can be avoided.

In the above first to third embodiments, the example of application of the present invention to a HiFix used for testing IC devices in the packaged state was explained, but the invention is not particularly limited to this. It is also possible to apply the present invention to a wafer mother board used for testing IC devices built into a wafer as explained below.

FOURTH EMBODIMENT

Figure 11:
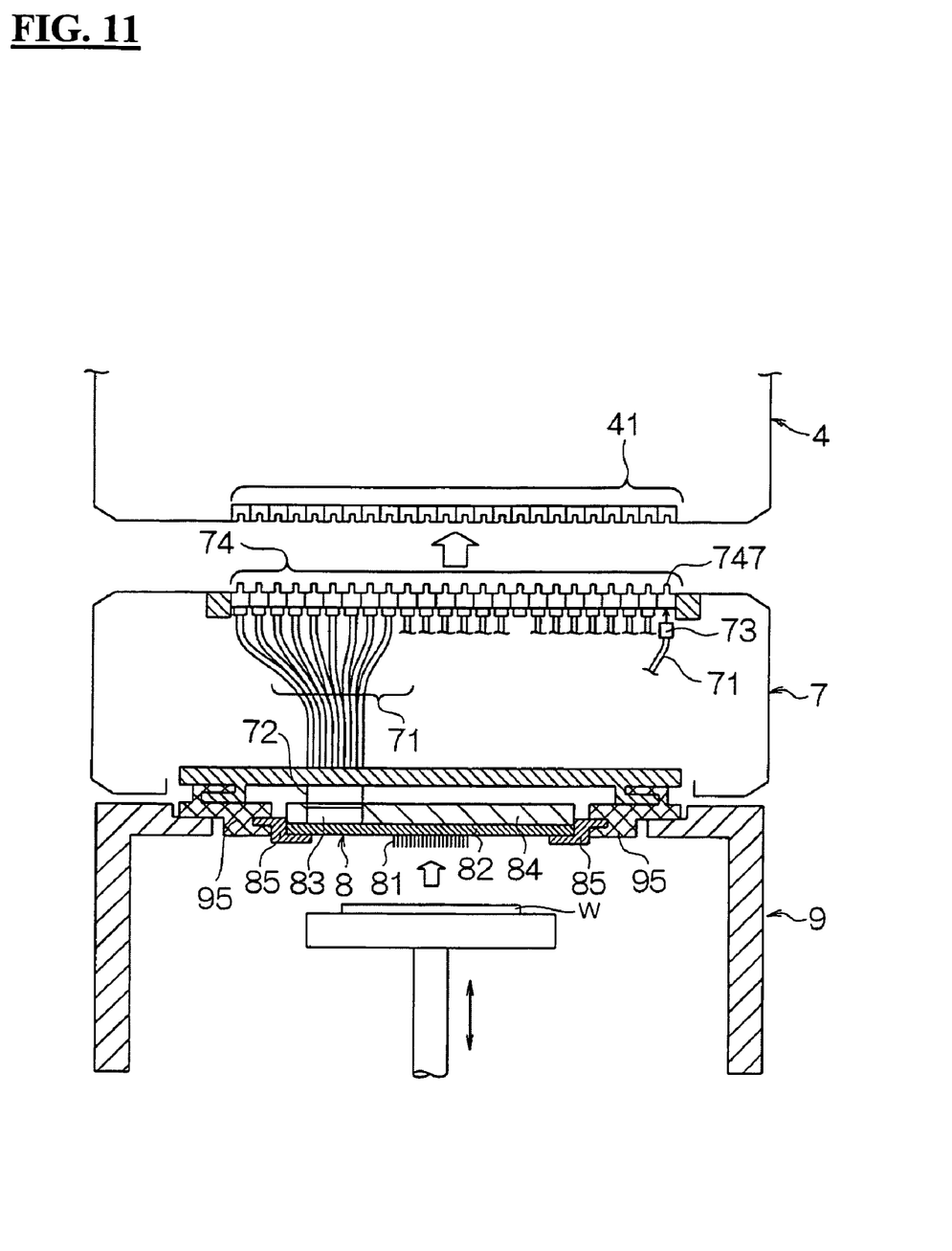
FIG. 11 is a cross-sectional view showing a wafer mother board and a test head according to a fourth embodiment of the present invention.

FIG. 11 is a cross-sectional view showing a wafer mother board and a test head according to a fourth embodiment of the present invention.

The electronic device test apparatus in the present invention is a apparatus for testing IC devices formed on a wafer W and comprises: a test head 4 electrically connected to the tester (not shown) through cables (not shown); a probe card 8 electrically contacting IC devices under test on the wafer W; and a prober 9 pushing the wafer W to the probe card 8.

The probe card 8, as shown in FIG. 11, is electrically connected through the wafer mother board (interface apparatus) 7 to the test head 4. This probe card 8 comprises: a large number of probe needles 81 electrically contacting the input/output terminals of the IC devices on the wafer W; a printed board 82 to which the probe needles 81 are mounted; ZIF (Zero Insertion Force) connectors 83 for electrically connecting the probe card 8 to the wafer mother board 7; and a stiffener 84 for reinforcing the probe card 8.

This probe card 8, as shown in FIG. 11, is held at the ring-shaped card holder 85 so that the probe needles 81 face the bottom through the center opening. Further, this card holder 85 is clamped to a ring-shaped adapter 95.

The test head 4 has a wafer mother board 7 mounted at its bottom. This wafer mother board 7 has ZIF connectors 72 provided at the bottommost part. A plurality of electrical cables 71 are led out from the ZIF connectors 72. At the top ends of the electrical cables 71, in the same way as the first embodiment, device side connectors 73 are attached. Note that as the electrical cables 71, for example, coaxial cables for transmitting high speed signals, single wires for supplying power or transmitting low speed signals, etc. may be illustrated.

At the topmost part of the wafer mother board 7, a plurality of intermediate connectors 74 similar to the intermediate connectors 53 explained in detail in the first embodiment are provided in the state arranged substantially in parallel along the depth direction of the wafer mother board 7. The engagement holes of the intermediate connectors 74 are designed to enable attachment/detachment of the device side connectors 73 attached to the ends of the electrical cables 71.

In the present embodiment, unlike the first to third embodiments, the output terminals 747 of the intermediate connectors 74 project out upward so as to be able to engage with engagement holes of the test head side connectors 41 provided at the bottommost part of the test head 4.

When a device side connector 73 is engaged with the intermediate connector 74, the terminals of the device side connector 73 are electrically connected to the output terminal of the intermediate connector 74. Further, when the output terminal 747 of the intermediate connector 74 is engaged with the engagement hole of the test head side connector 41, the wafer mother board 7 and the test head 4 are electrically connected.

In the above-explained fourth embodiment, by employing the intermediate connectors 74, there is no longer any soldering work of the ends of the electrical cables 71, so a wafer mother board 7 can be easily fabricated. Further, by selectively connecting the device side connectors 74 to the intermediate connectors 74, any circuit wiring can be formed. Further, repair and replacement of the intermediate connectors 74 are possible by just detaching the device side connectors 73 from the intermediate connectors 74, so the mainte-nance ability is superior. Further, in the present embodiment, no circuit board is used, so impedance mismatch can be avoided.

Note that the above-explained embodiments were described in order to facilitate understanding of the present invention and were not described in order to limit the present invention. Therefore, the elements disclosed in the above embodiments include all design modifications and equivalents belonging to the technical scope of the present invention.

In the present invention, without regard to directly or indirectly, it is sufficient that the socket boards 65 and the electrical cables 54 be electrically connected. For example, like with the SBC type of the first embodiment or the CLS type of the second embodiment, the present invention can be applied even if the socket boards 56 and the electrical cables 54 are indirectly connected through the intermediate terminals 545 or the connectors 59 between the socket boards 65 and the electrical cables 54. Further, as with the CCN type of third embodiment, the present invention can be applied even if the socket boards 65 and the electrical cables 54 are directly connected.

Further, in the above-mentioned embodiments, it is explained that the device side connectors 541 are inserted into the engagement holes 532 of the intermediate connectors 53, but the present invention is not particularly limited to this. For example, it is also possible to provide the device side connectors 541 with engagement holes and provide projecting parts at top surfaces of the intermediate connectors 53 and insert the intermediate connectors 53 into the device side connectors 541.

In the same way, in the above-mentioned embodiments, it is explained that the output terminals 537 projecting out from the intermediate connectors 53 are inserted into the engagement holes 42 of the test head side connectors 41, but the present invention is not particularly limited to this. For example, it is also possible to provide engagement holes at the bottom surfaces of the intermediate connectors 53 and provide the test head side connectors 41 with the projecting parts, and insert the test head side connectors 41 into the intermediate connectors 53.

The invention claimed is:

1. An interface apparatus mounted on a test head for testing a device under test and interconnecting an electrical connection between the device under test and the test head, wherein the interface apparatus comprises:
    an electrical cable having one end electrically connected to a measurement board electrically contacting the device under test;
    a device side connector attached to the other end of the electrical cable; and
    a plurality of intermediate connectors electrically connecting a test head side connector provided on the test head and the device side connector; and
    a frame-shaped frame holding a plurality of the intermediate connectors, and each of the intermediate connectors has:
    a housing held at the both ends of the housing by the frame;
    a plurality of first connection parts provided at the housing and to which the device side connector is detachably connected, and
    a plurality of second connection parts provided at the housing and to which the test head side connector is detachably connected
    wherein a plurality of the intermediate connectors are collaterally arranged.

2. The interface apparatus as set forth in claim 1, wherein the adjacent intermediate connectors are in close contact with each other.

3. The interface apparatus as set forth in claim 2, wherein a plurality of the first connection parts are arranged in rows.

4. The interface apparatus as set forth in claim 1, wherein
the device under test is a packaged semiconductor device, and
the measurement board is a socket board on which a socket electrically contacting the semiconductor device is mounted.

5. The interface apparatus as set forth in claim 1, wherein
the device under test is a semiconductor device formed on a wafer, and
the measurement board is a probe card on which probe needles electrically contact the semiconductor device are mounted.

6. An interface apparatus mounted on a test head for testing a device under test and interconnecting an electrical connection between the device under test and the test head, wherein the interface apparatus comprises:

an electrical cable having one end electrically connected to a measurement board electrically contacting the device under test;
a device side connector attached to the other end of the electrical cable; and
an intermediate connector electrically connecting a test head side connector provided on the test head and the device side connector, and
the intermediate connector has:
a connector body provided at a position adjoining the test head at the interface apparatus:
a first connection part provided at the connector body and to which the device side connector is detachably connected; and
a second connection part provided at the connector body and to which the test head side connector is detachably connected,
wherein the intermediate connector has a positioning pin or hole facing a positioning hole or pin which the test head side connector has.

* * * * *